(12) United States Patent
Amamiya

(10) Patent No.: US 7,375,568 B2
(45) Date of Patent: May 20, 2008

(54) LOGIC CIRCUIT WITH RESTRAINED LEAK CURRENT TO DIFFERENTIAL CIRCUIT

(75) Inventor: Yasushi Amamiya, Tokyo (JP)

(73) Assignee: NEC Corporation, Tokyo (JP)

( * ) Notice: Subject to any disclaimer, the term of this patent is extended or adjusted under 35 U.S.C. 154(b) by 172 days.

(21) Appl. No.: 10/560,930

(22) PCT Filed: Jun. 16, 2004

(86) PCT No.: PCT/JP2004/008436

§ 371 (c)(1),
(2), (4) Date: Dec. 15, 2005

(87) PCT Pub. No.: WO2004/112247

PCT Pub. Date: Dec. 23, 2004

(65) Prior Publication Data

US 2007/0097579 A1    May 3, 2007

(30) Foreign Application Priority Data

Jun. 16, 2003    (JP)    ............................. 2003-171057

(51) Int. Cl.
*H03K 3/12* (2006.01)
(52) U.S. Cl. .................... 327/218; 327/202; 327/219
(58) Field of Classification Search .................. None
See application file for complete search history.

(56) References Cited

U.S. PATENT DOCUMENTS

| 4,532,440 | A | * | 7/1985 | Barre | ........................ 327/198 |
|---|---|---|---|---|---|
| 4,686,394 | A | * | 8/1987 | Lam | ........................... 326/126 |
| 4,777,388 | A | * | 10/1988 | Widener | ..................... 327/202 |
| 4,977,335 | A | | 12/1990 | Ogawa | |
| 5,289,055 | A | | 2/1994 | Razavi | |
| 5,760,626 | A | * | 6/1998 | Pelley, III | ................... 327/207 |
| 5,900,760 | A | | 5/1999 | Lee | |
| 6,850,104 | B2 | * | 2/2005 | Fattaruso | .................... 327/202 |

FOREIGN PATENT DOCUMENTS

| JP | 62-224109 | 10/1987 |
|---|---|---|
| JP | 63-086611 | 4/1988 |
| JP | 63-220615 | 9/1988 |

(Continued)

*Primary Examiner*—N. Drew Richards
*Assistant Examiner*—An T. Luu
(74) *Attorney, Agent, or Firm*—Foley & Lardner LLP

(57) ABSTRACT

In the present invention, a logic circuit is provided therein with a current supply control circuit for controlling the amount of current supplied to a differential circuit. This current supply control circuit comprises a bypass path for bypassing the current around the differential circuit, a switching transistor interposed in the bypass path for opening/closing the bypass path in accordance with the signal level of a clock signal applied thereto from the outside, and a current amount control transistor for controlling the amount of current supplied to the differential circuit. The current amount control transistor adjusts the amount of current in accordance with the signal level of the clock signal. The current amount control transistor is configured to ensure a sufficient amount of current when current flows into the differential circuit in response to the clock signal, and to sufficiently reduce the amount of current that flows into the bypass circuit, thus reducing the amount of current leaking to the differential circuit when current flows into the bypass circuit.

25 Claims, 10 Drawing Sheets

FOREIGN PATENT DOCUMENTS

| | | |
|---|---|---|
| JP | 02-021717 | 1/1990 |
| JP | 06-224738 | 8/1994 |
| JP | 07-030405 | 1/1995 |
| JP | 08-018435 | 1/1996 |
| JP | 10-075162 | 3/1998 |
| JP | 11-103240 | 4/1999 |
| JP | 2002-290212 | 10/2002 |

\* cited by examiner

Title: Logic Circuit with Restrained Leak ...
Inventor: Yasushi Amamiya
App. Ser. No.: 10/560,930
Atty. Dkt. No.: 040373-0367
Fig. 1 (Prior Art)
Replacement Sheet
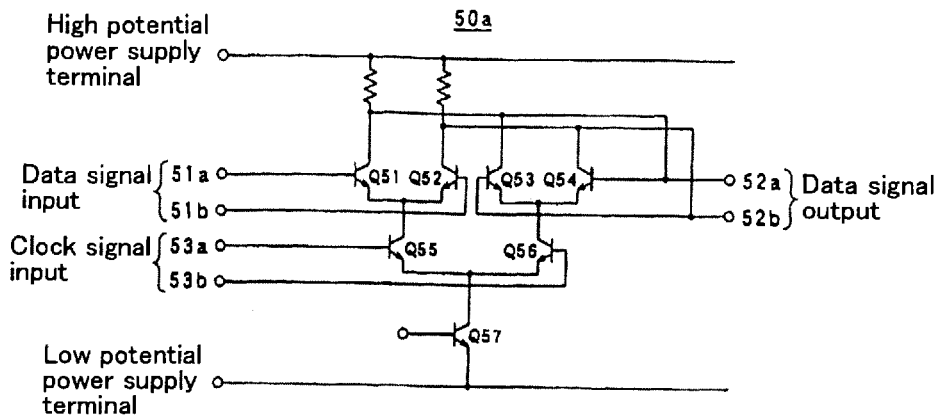

LOGIC CIRCUIT WITH RESTRAINED LEAK CURRENT TO DIFFERENTIAL CIRCUIT

TECHNICAL FIELD

The present invention relates to logic circuits such as a latch circuit

BACKGROUND ART

There is known a latch circuit which comprises a differential circuit as a basic element circuit of logic circuits used in a variety of semiconductor integrated circuits.

FIG. 1 illustrates a circuit diagram of a conventional general latch circuit. As illustrated in FIG. 1, conventional latch circuit 50a comprises a vertical stack for a total of three stages which include a differential circuit (a differential pair composed of transistors Q51 and Q52 and the like) stage for reading data and a differential circuit (a differential pair composed of transistors Q53 and Q54 and the like) stage for holding data; a differential circuit (a differential pair composed of transistors Q55, Q56 or the like) stage which receives a clock signal and which functions to switch a current to an upper stage of the differential circuit; and a stage of transistor Q57, at a lower stage than that, for regulated current source.

Thus, the foregoing configuration requires a higher supply voltage, as compared with other basic circuit elements, and constitutes an impediment to a total reduction in voltage and power consumption when the logic circuit is integrated into one chip or a modular form together with other functional circuit blocks. Consequently, a large challenge has been to restrain power consumption of the latch circuit (see, for example, JP-A-63-86611 and JP-A-2-21717).

As a measure to reduce voltage for such a latch circuit, a circuit as illustrated in FIG. 2, for example, is proposed in JP-A-63-86611 and JP-A-2-21717.

FIG. 2 illustrates a circuit diagram of a latch circuit which has two differential circuits arranged in parallel (parallelly arranged latch circuit). In latch circuit 50b illustrated in FIG. 2, a current switching transistor (Q58), which is applied with a clock signal, has an emitter terminal connected to a common emitter terminal of a differential circuit (composed of transistors Q51 and Q52 and the like), while a current switching transistor (Q59) has an emitter terminal connected to a common emitter terminal of a differential circuit (composed of transistors Q53 and Q54 and the like).

In such a circuit configuration, only if logical amplitudes are set high for the current switching transistors (Q58, Q59) will a current to the differential circuits be shut off when the clock signal is at a high level because current from a regulated current source flows through the current switching transistors (Q58, Q59). On the other hand, when the clock signal is at a low level, the current from the regulated current source flows through the differential circuits.

In the foregoing manner, in the circuit illustrated in FIG. 2, a latching operation is implemented by switching a current in synchronization with the clock. In this way, the need to arrange a vertical stack of differential circuits is eliminated, thus making it possible to reduce the voltage.

However, the conventional circuit has problems shown below.

So that latch circuit 50b as illustrated in FIG. 2 operates correctly, a strong influence on the switching operate under control of the clock signal must be increased, as compared with data signals, such that currents from current source transistors (Q60, Q61) will always flow through the current switching transistors (Q58, Q59) when the clock signal is at a high level. This can be made possible by setting the size of the current switching transistors (Q58, Q59) larger than the transistors (Q51, Q52, Q53, Q54) which made up the differential circuits. As the size of the transistors (Q58, Q59) is larger, the strong influence of the clock signal is increased. However, the use of excessively large transistors would result in a degradation in high-speed performance and an increase in consumed current.

Thus, there are limitations in the size of the current switching transistors (Q58, Q59) per se, so that it is actually difficult to completely have a strong influence on the current switching transistors (Q58, Q59). For this reason, even when the clock signal is at a high level, part of the current supplied from a current source will leak to the differential circuits.

FIG. 3 is a diagram representing the relationship between current I1 which flows into a current switching transistor and current I2 which flows into a differential circuit from a current source in a parallelly arranged latch circuit when it is in operation. It can be seen that when the current switching transistor (Q58) turns on to allow I1 to flow, current I2 to the differential circuit, which should be essentially shut off, is not completely eliminated (portion A in the figure), but a leak current flows. A reduction in potential level of a data signal due to this leak current can lead to a degradation in output waveform and the like, if the reduction is not negligible with respect to a logical amplitude of data.

Also, irrespective of the type of circuit forms that make up latch circuits, generally, when an attempt is made to reduce a supply voltage, VCE distributed to each transistor cannot but be reduced. For this reason, an optimal operating condition cannot always be selected for high frequency performance of a device, thus leading to difficulties in ensuring high-speed performance. As a measure to improve high speed performance, an inductor keeping technique is effective.

FIG. 4 illustrates a circuit diagram of a parallelly arranged latch circuit which has improved high-speed performance. To improve high-speed performance, a wire is extended on a collector side of a differential circuit (transistors Q51 and Q52 or transistors Q53 and Q54), or a spiral inductor is disposed on the collector side. Based on parallel resonance of inductance L produced herein and capacitance C of a transistor connected at the next stage, the gain is increased in a high frequency region to improve high-speed performance.

Incidentally, in regard to a parallelly arranged latch circuit, the improvement in high-speed performance is desirable for the current switching transistors (Q58, Q59) as well, except for the differential circuit. However, in the example of FIG. 4, the collectors of the current switching transistors (Q58, Q59) are simply connected to a high potential power supply terminal through resistors, but circuits including transistors are not at all connected, so that a capacitive component in this portion is nothing but an extremely small stray capacitance. Thus, for giving rise to gain peaking based on parallel resonance in a desired high frequency region, an extremely large wiring inductance is required, thereby making improvement in high-speed performance unrealistic due to restraints in the chip area.

A large number of latch circuits are used in a variety of functional circuits. FIG. 5 is a diagram illustrating circuit blocks of 2:1 MUX. As illustrated in FIG. 5, 2:1 MUX comprises circuit elements such as master/slave flip-flop circuit (MS-F/F) 71, master/slave/master flip-flop circuit (MSM-F/F) 72, selector circuit (SELECTOR) 73, and the like. Each of these circuit elements is built using latch circuits. Here, since complementary clock signals are supplied to each circuit element, the clock signal is branched into a large number of paths. For this reason, a buffer circuit is required in each branch for signal amplification, resulting in an increased number of circuits and increased power consumption. Therefore, in integrated functional circuits, it is necessary not only to reduce power consumption of respective latch circuits, but also to reduce the number of circuits such as buffer circuits (BUF).

DISCLOSURE OF THE INVENTION

It is an object of the present invention to provide a logic circuit such as a latch circuit, selector circuit and the like, which excels in a low voltage, low power consumption, and high-speed performance by mainly restricting a leak current to a differential circuit.

To achieve the above object, in the present invention, a logic circuit is provided therein with a current supply control circuit for controlling the amount of current supplied to a differential circuit. This current supply control circuit comprises a bypass path for bypassing the current around the differential circuit, a switching transistor interposed in the bypass path for opening/closing the bypass path in accordance with the signal level of a clock applied from the outside, and a current amount control transistor for controlling the amount of current supplied to the differential circuit. The current amount control transistor adjusts the amount of current in accordance with the signal level of the clock signal. The current amount control transistor is configured to ensure a sufficient amount of current when current flows into the differential circuit in response to the clock signal, and to thoroughly reduce an amount of current when current flows into the bypass circuit, thus reducing the amount of current leaking to the differential circuit when a current flows into the bypass circuit.

According to the present invention, since the amount of current supplied to the differential circuit is adjusted in accordance with the signal level of the clock signal, unwanted leak current can be automatically restrained from flowing into the differential circuit. Also, by using such a configuration, the size of transistors used in the logic circuit can be reduced in order to increase speed and reduce power consumption.

BRIEF DESCRIPTION OF THE DRAWINGS

[FIG. 1]
A circuit diagram of a general latch circuit in the prior art.

BEST MODE FOR CARRYING OUT THE INVENTION (First Embodiment)
Referring first to FIG. 6, a description will be given of the configuration of a latch circuit according to a first embodiment of the present invention.

Figure 6:
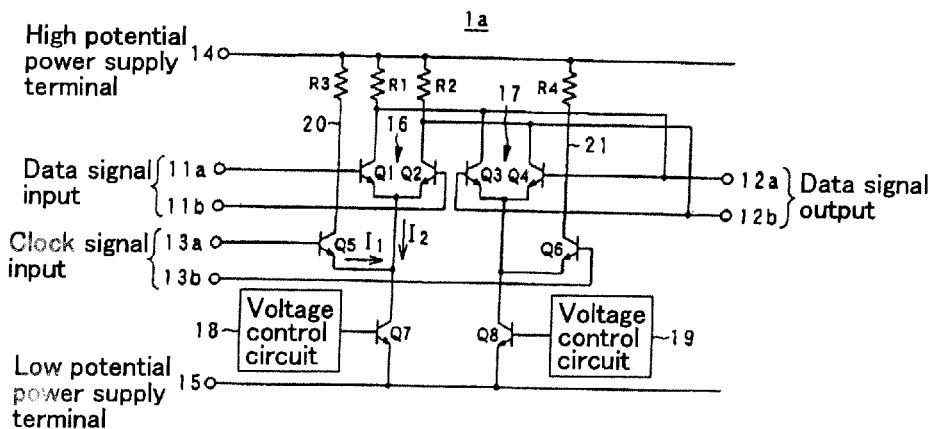
[FIG. 6]
A circuit diagram of a latch circuit according to a first embodiment of the present invention.
Figure 11A:
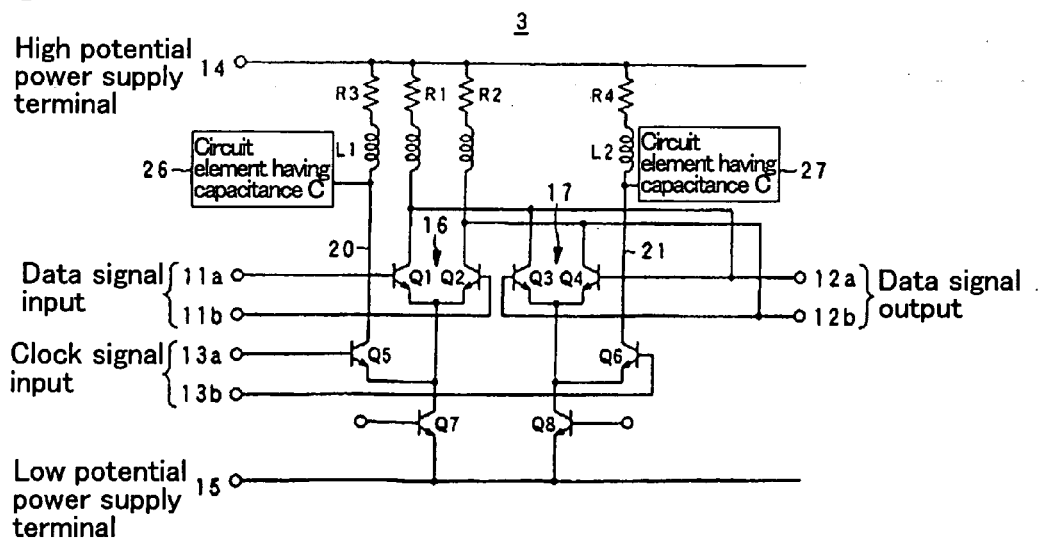
[FIG. 11A]
A circuit diagram of a latch circuit according to a fourth embodiment of the present invention.
Figure 11B:
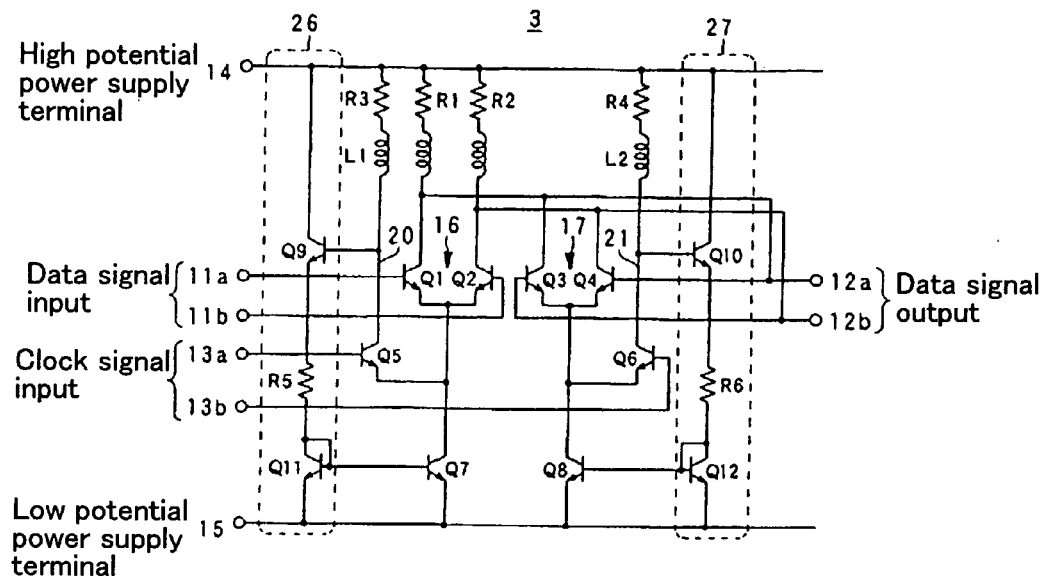
[FIG. 11B]
A circuit diagram illustrating details of circuits 26, 27 including capacitance C in the latch circuit of FIG. 11A.

FIG. 6 illustrates a circuit diagram of the latch circuit according to the first embodiment of the present invention. In FIG. 6, 11a and 11b designate data signal input terminals;

12a and 12b data signal output terminals; 13a and 13b clock signal input terminals; 14a high potential power supply terminal which is supplied with potential Vcc; and 15a low potential power supply terminal which is supplied with potential Vee.

For reference purposes, a data signal applied to data signal input terminal 11b is a data complementary signal, the signal (logical) level of which is inverted from that of a data signal applied to data signal input terminal 11a. Also, a clock signal applied to clock signal input terminal 13b is a complementary clock signal, the signal level of which is inverted from that of a clock signal applied to clock signal input terminal 13a.

As illustrated in FIG. 6, latch circuit 1a of the first embodiment includes data reading differential pair 16 as a first differential circuit for reading data signals applied from data signal input terminals 11a and 11b; data holding differential pair 17 as a second differential circuit for holding the data signals; voltage control circuit 18 and current source transistor Q7 as first control means for controlling the amount of current supplied to data reading differential pair 16; voltage control circuit 19 and current source transistor Q8 as second control means for controlling the amount of current supplied to data holding differential pair 17; first bypass path 20 for bypassing current around data reading differential pair 16; second bypass path 21 for bypassing current around data holding differential pair 17; current switching transistor Q5 as first switching means for opening and closing first bypass path 20 in accordance with the signal level of the clock signal applied from clock signal input terminal 13a; and current switching transistor Q6 as second switching means for opening and closing second bypass path 21 in accordance with the signal level of the complementary clock signal applied from clock signal input terminal 13b.

For reference purposes, bypass path 20, current switching transistor Q5, voltage control circuit 18, and current source transistor Q7 (or bypass path 21, current switching transistor Q6, voltage control circuit 19, and current source transistor Q8) function as a current supply control circuit of the present invention.

Data reading differential pair 16 includes transistors Q1 and Q2, wherein transistor Q1 has a collector (terminal) connected to high potential power supply terminal 14 through resistor R1, while transistor Q2 has a collector connected to high potential power supply terminal 14 through resistor R2. Also, the collector of transistor Q1 is connected to data signal output terminal 12a, and the collector of transistor Q2 is connected to data signal output terminal 12b, respectively. As well, transistor Q1 has a base (terminal) connected to data signal input terminal 11a, and transistor Q2 has a base connected to data signal input terminal 11b, respectively. Also, a common emitter of data reading differential pair 16, i.e., an emitter connection point of transistors Q1 and Q2, is connected to an emitter (terminal) of current switching transistor Q5 and to a collector of current source transistor Q7.

Further, current switching transistor Q5 has a collector connected to high potential power supply terminal 14 through resistor R3, and current switching transistor Q5 has a base connected to clock input terminal 13a. In other words, current switching transistor Q5 is arranged for interposition in first bypass path 20.

As well, current source transistor Q7 has a base connected to voltage control circuit 18, and current source transistor Q7 has an emitter connected to low potential power supply terminal 15.

On the other hand, data holding differential pair 17 includes transistors Q3 and Q4, wherein transistor Q3 has a collector connected to the collector of transistor Q1 and to data signal output terminal 12a, and transistor Q4 has a collector connected to the collector of transistor Q2 and to data signal output terminal 12b, respectively. Also, transistor Q3 has a base connected to data signal output terminal 12b, and transistor Q4 has a base connected to data signal output terminal 12a, respectively. Also, a common emitter of data holding differential pair 17, i.e., an emitter connection point of transistors Q3 and Q4, is connected to an emitter of current switching transistor Q6 and to a collector of current source transistor Q8.

Further, current switching transistor Q6 has a collector connected to high potential power supply terminal 14 through resistor R4, and current switching transistor Q6 has a base connected to clock input terminal 13b. In other words, current switching transistor Q6 is arranged for interposition in second bypass path 21.

Like wise, current source transistor Q8 has a base connected to voltage control circuit 19, and current source transistor Q8 has an emitter connected to low potential power supply terminal 15.

Then, voltage control circuit 18 is configured to adjust the amount of current supplied to data reading differential pair 16 in accordance with the signal level of the clock signal. More specifically, voltage control circuit 18 adjusts the current level such that the amount of current supplied to data reading differential pair 16 when the signal level of the clock signal is at a low level is larger than the amount of current supplied to data reading differential pair 16 when the signal level is at a high level. In other words, a high potential level is applied to the base point of current source transistor Q7 when the clock signal is at a low level, while a low potential level is applied to the base point of current source transistor Q7 when the clock signal is at a high level.

Likewise, voltage control circuit 19 is configured to adjust the amount of current supplied to data holding differential pair 17 in accordance with the signal level of the complementary clock signal. More specifically, voltage control circuit 19 adjusts the current level such that the amount of current supplied to data holding differential pair 17 when the signal level of the complementary clock signal is at a low level is larger than the amount of current supplied to data holding differential pair 17 when the signal level is at a high level. In other words, voltage control circuit 19 applies voltage at a high potential level to the base point of current source transistor Q8 when the complementary clock signal is at a low level, and applies a low potential level to the base point of current source transistor Q8 when the complementary clock signal is at a high level.

Next, the operation of the latch circuit of the first embodiment will be described with reference to FIG. 6.

Since current switching transistor Q5 does not operate (off operation) when the clock signal applied from clock signal input terminal 13a is at a low level, first bypass path 20 is opened (non-conducting state). Therefore, no current flows into first bypass path 20, and a current through current source transistor Q7 is completely supplied to data reading differential pair 16. In this event, voltage control circuit 18 applies the high potential level to the base point of current source transistor Q7 in synchronization with the opened state of first bypass path 20. As a result, current source transistor Q7 supplies a sufficient amount of current to data reading differential pair 16.

On the other hand, when the clock signal applied from clock signal input terminal 13a is at a high level, current switching transistor Q5 operates (on operation), causing first bypass path 20 to close (conducting state). Therefore, a current supplied from current source transistor Q7 passes through first bypass path 20. In this event, voltage control circuit 18 applies voltage at a low potential level to the base point of current source transistor Q7 in synchronization with the closed state of first bypass path 20. As a result, a reduced amount of current is supplied to data reading differential pair 16 by current source transistor Q7. This also restricts the amount of unwanted leak current which flows into data reading differential pair 16.

For reference purposes, when the clock signal applied from clock signal input terminal 13a is at a low level, the complementary clock signal applied from clock signal input terminal 13b is at a high level, so that current switching transistor Q6 operates (on operation), causing second bypass path 21 to close (conducting state). In this event, voltage control circuit 19 operates in a way that is opposite to the way that voltage control circuit 18 operates, i.e., applies a signal at a low potential level to the base point of current source transistor Q8. On the other hand, when the clock signal applied from clock signal input terminal 13a is at a high level, the complementary clock signal applied from clock signal input terminal 13b is at a low level, so that current switching transistor Q6 does not operate (off operation), causing second bypass path 21 to open (non-conducting state). The operation of voltage control circuit 19 in this event is a reverse operation to voltage control circuit 18, i.e., applies a signal at the high potential level to the base point of current source transistor Q8.

As described above, according to the first embodiment, voltage control circuit 18 or 19 applies, to the base point of current source transistor Q7 or Q8, voltage at a potential level which is high or low in synchronization with the opening/closing of bypass path 20 or 21 (in synchronization with the clock), so that the unwanted leak current can be automatically restrained from flowing into differential pairs 16 and 17 to realize a low-voltage latch circuit with a high-margin which is free of data errors.

Also, in order that a conventional parallelly arranged latch circuit operates correctly, the size of a current switching transistor must be larger than transistors which make up a data reading differential pair (or a data holding differential pair), for example, by a factor of approximately four, for purposes of providing a clock signal with an imposing force. In contrast, latch circuit 1a of the first embodiment can be operated correctly even when the size of current switching transistors (Q5, Q6) is limited to be larger than the transistors (Q1, Q2, Q3, Q4), which make up the differential pairs, by a factor of approximately one to two. Further, since the transistor size can be limited, latch circuit 1a of the first embodiment can produce an increase in speed and a reduction in consumed current.

(Second Embodiment)

A second embodiment implements voltage control circuits 18 and 19 in the first embodiment.

Figure 7A:
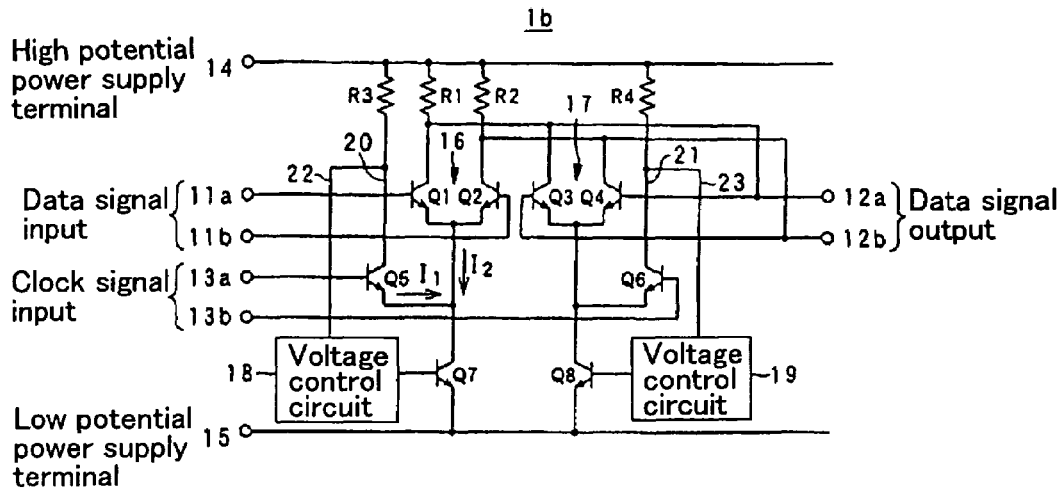
[FIG. 7A]
A circuit diagram of a latch circuit according to a second embodiment of the present invention.
Figure 7B:
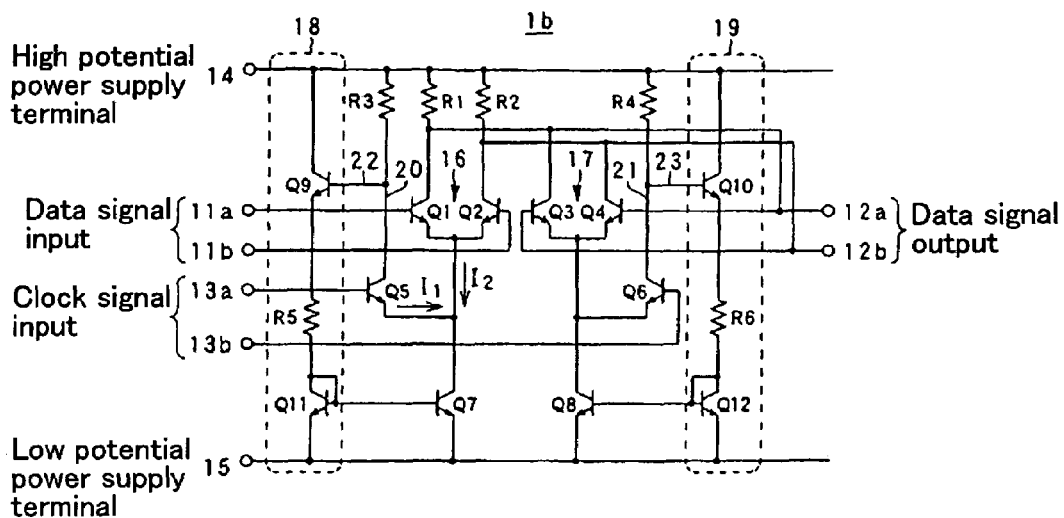
[FIG. 7B]
A circuit diagram illustrating details of voltage control circuits 18, 19 in the latch circuit of FIG. 7A.

Referring first to FIGS. 7A, 7B, a description will be given of the configuration of a latch circuit of the second embodiment. In this regard, in the latch circuit of the second embodiment, similar components to those in the latch circuit of the first embodiment are designated the same reference numerals. In addition, the same descriptions are omitted.

FIGS. 7A, 7B illustrate circuit diagrams of the latch circuit of the second embodiment. In this regard, since data reading differential pair 16 has a circuit identical to the circuit of data holding differential pair 17 in the connection layout (substantially in bilateral symmetry), elements such as transistors in the circuit of data holding differential pair 17 are placed in parenthesis in the following description (the same applies to a third embodiment onward).

As illustrated in FIG. 7A, in latch circuit 1b, voltage control circuit 18 (or 19) is disposed between the collector of current switching transistor Q5 (or Q6) and the base of current source transistor Q7 (or Q8), and has feedback path 22 (or 23) for applying information to the base of current source transistor Q7 (or Q8), about the signal level at the collector point of current switching transistor Q5 (or Q6). In this way, the amount of current supplied by current source transistor Q7 (or Q8) can be controlled in synchronization with the opening/closing of bypass path 20 (or 21), thus restricting unwanted leak current from flowing into differential pair 16 (or 17).

FIG. 7B illustrates a specific example of voltage control circuits 18 and 19. Voltage control circuit 18 (or 19) comprises transistor Q9 (or Q10), transistor Q11 (or Q12), and the like. Transistor Q9 (or Q10) has a collector connected to high potential power supply terminal 14; a base connected to the collector of current switching transistor Q5 (or Q6); and an emitter to the collector and the base of transistor Q11 (or Q12) through resistor R5 (or R6). Transistor Q11 (or Q12) in turn has the collector and base connected to the base of current source transistor Q7 (or Q8), and an emitter connected to low potential power supply terminal 15.

Referring next to FIG. 7B, a description will be given of the operation of the latch circuit of the second embodiment.

When the clock signal applied from clock signal input terminal 13a is at a low level, current switching transistor Q5 does not operate (off operation), causing first bypass path 20 to open (non-conducting state), so that voltage at a high potential level is applied to the collector of transistor Q5, i.e., the base of transistor Q9 through resistor R3, resulting in an increase in the amount of current flowing into voltage control circuit 18. Thus, the potential level increases at the base and collector points of transistor Q11 in voltage control circuit 18, resulting in an increase in the amount of collector current of current source transistor Q7 in the base point of which an input point is set at this point. In other words, voltage control circuit 18 applies the high potential level to the base point of current source transistor Q7 in synchronization with the opened state of first bypass path 20. As a result, current source transistor Q7 supplies a sufficient amount of current to data reading differential pair 16.

On the other hand, when the clock signal applied from clock signal input terminal 13a is at a high level, current switching transistor Q5 operates (on operation), causing first bypass path 20 to close (conducting state), so that voltage at a low potential is applied to the base of transistor Q9 through resistor R3, resulting in a reduction in the amount of current flowing into voltage control circuit 18. Thus, the potential level decreases at the base and at the collector points of transistor Q11 in voltage control circuit 18, resulting in a reduction in the amount of collector current of current source transistor Q7 in the base point of which an input point is set at this point. In other words, voltage control circuit 18 applies voltage at a low potential level to the base point of current source transistor Q7 in synchronization with the closed state of first bypass path 20. As a result, the amount of unwanted leak current is also restrained from flowing into data reading differential pair 16.

For reference purposes, when the clock signal applied from clock signal input terminal 13a is at a low level, the complementary clock signal applied from clock signal input terminal 13b is at a high level, so that current switching transistor Q6 operates (on operation), causing second bypass path 21 to close (conducting state). The operation of voltage control circuit 19 (operation of transistor Q10 and transistor Q12) in this event is similar to the operation of voltage control circuit 18 (operation of transistor Q9 and transistor Q11) when the clock signal is at a high level. On the other hand, when the clock signal applied from clock signal input terminal 13a is at a high level, the complementary clock signal applied from clock signal input terminal 13b is at a low level, so that current switching transistor Q6 does not operate (off operation), causing second bypass path 21 to open (non-conducting state). The operation of voltage control circuit 19 (operation of transistor Q10 and transistor Q12) in this event is similar to the operation of voltage control circuit 18 (operation of transistor Q9 and transistor Q11)) when the clock signal is at a low level.

Figure 2:
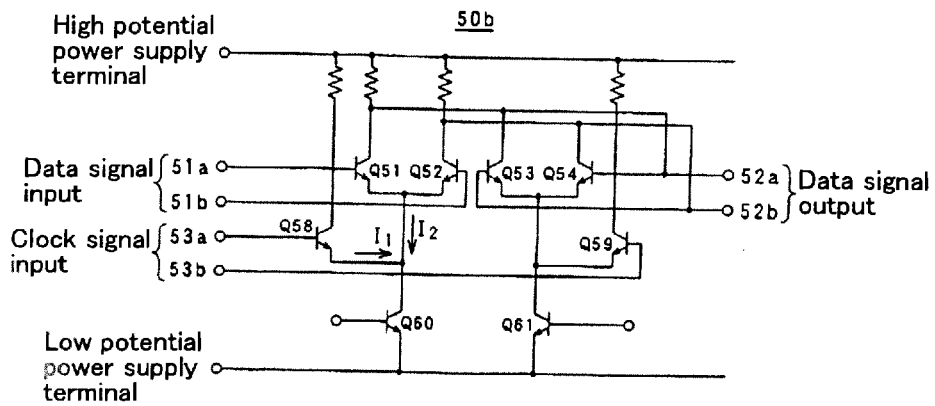
[FIG. 2]
A circuit diagram of a prior art latch circuit (parallelly arranged latch circuit) which has two differential circuits arranged in parallel.
Figure 3:
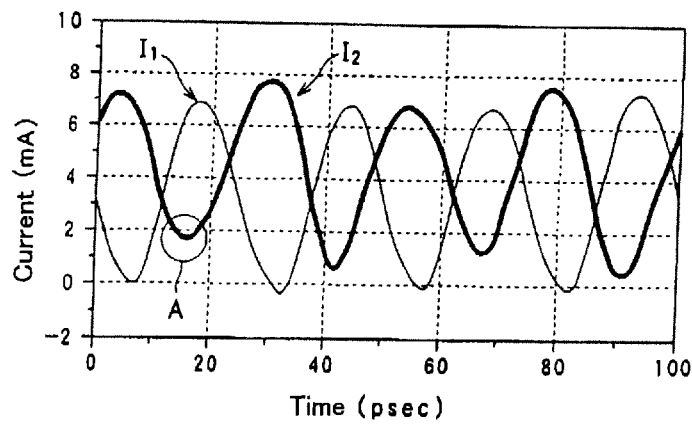
[FIG. 3]
A graph representing the relationship between current I1 which flows into a current switching transistor and current I2 which flows into a differential circuit from a current source in the latch circuit of FIG. 2 when it is in operation.
Figure 8A:
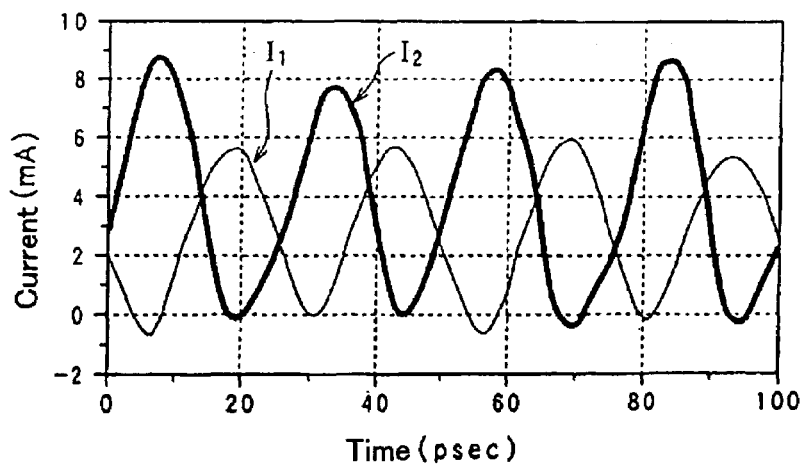
[FIG. 8A]
A graph representing the manner in which current I1 flowing through a bypass path and current I2 flowing through a differential pair vary in synchronization with variations in the clock level (signal level) of a clock signal in latch circuit 1b of FIG. 7B.
Figure 8B:
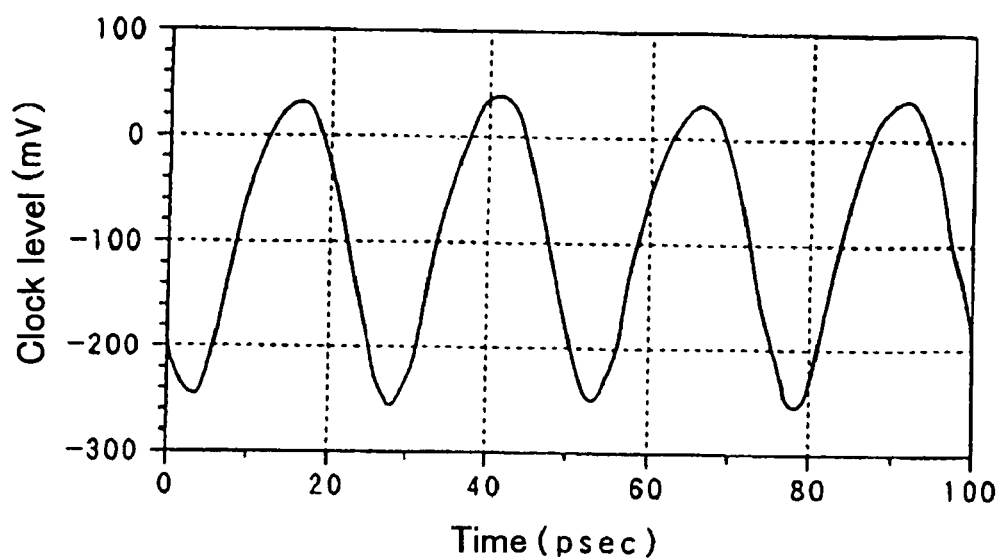
[FIG. 8B]
A graph representing variations in the clock level (signal level) of the clock signal.

FIG. 8A represents the manner in which current I1, which flows through the bypass path, and current I2, which flows through the differential pair, vary in synchronization with variations in the clock level (signal level) of the clock signal of FIG. 8B. As shown in FIG. 8A, it is understood that, as compared with the conventional latch circuit illustrated in FIG. 3, when the current switching transistor turns on to permit I1 to flow, current I2 is sufficiently restrained from flowing toward the differential pair to prevent unwanted leak current from flowing.

As described above, according to the second embodiment, in addition to the effects of the first embodiment, an unwanted leak current can be automatically restrained from flowing into the differential pair by feeding information about the signal level at the collector point of the current switching transistor back to the base of the current source transistor.

Figure 9A:
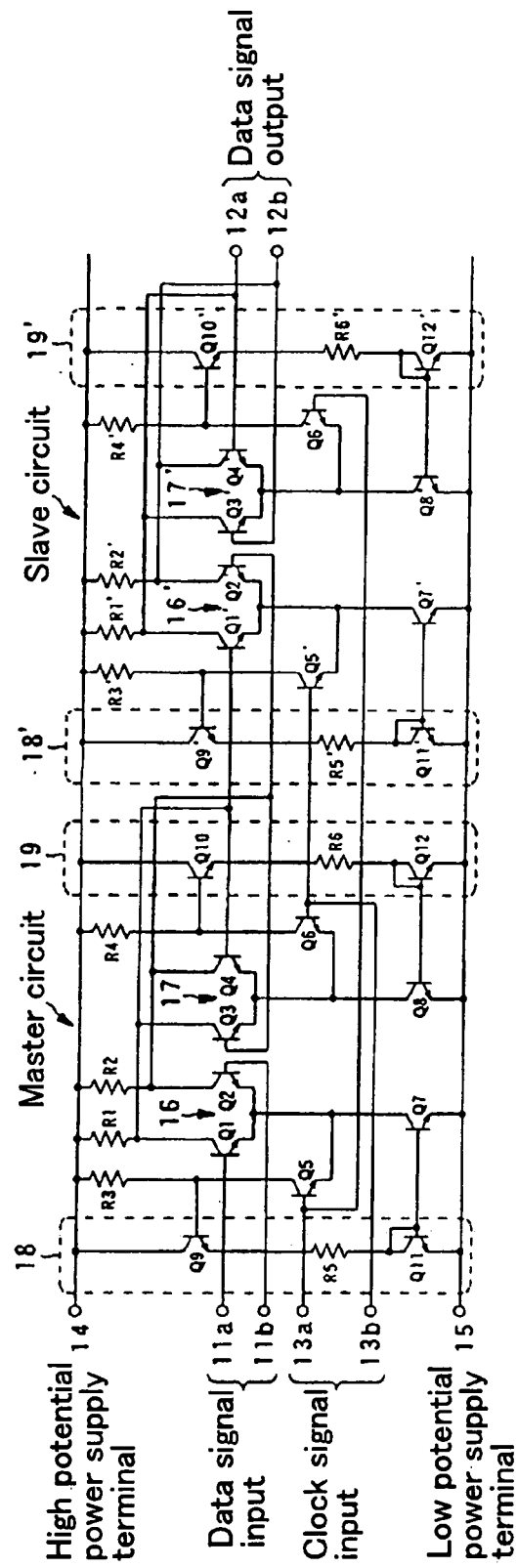
[FIG. 9A]
A circuit diagram of a master/slave D-type F/F circuit which employs the latch circuit of FIG. 7B and is used in an identifier and the like (when voltage control circuits 18, 19 are provided individually).
Figure 9B:
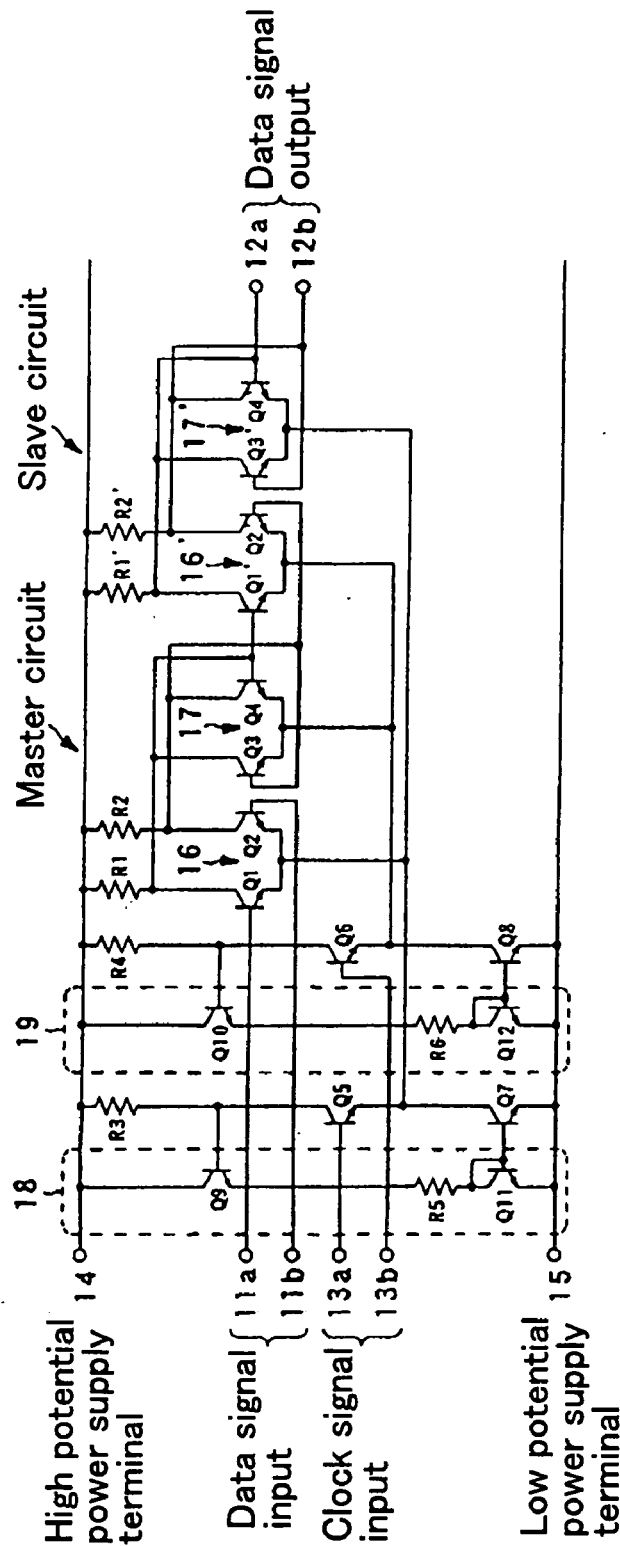
[FIG. 9B]
A circuit diagram of a master/slave D-type F/F circuit which employs the latch circuit of FIG. 7B and is used in an identifier and the like (when voltage control circuits 18, 19 are shared).

For reference purposes, latch circuit 1b described above can be applied to a variety of circuits. FIGS. 9A, B illustrate master/slave D-type flip-flop circuits. (F/F) which are used for identifiers and the like. In FIG. 9A, the latch circuit is employed for both a master circuit and a slave circuit. On the other hand, in FIG. 9B, a master circuit and a slave circuit share current switching transistors Q5 and Q6 and voltage control circuits 18 and 19 which make up the latch circuit.

(Third Embodiment)

Figure 10A:
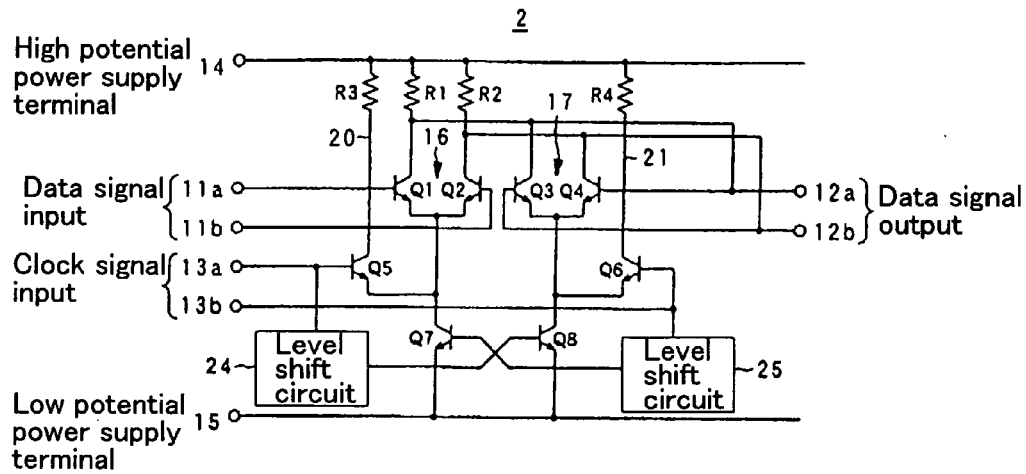
[FIG. 10A]
A circuit diagram of a latch circuit according to a third embodiment of the present invention.

Referring first to FIGS. 10A, B, a description will be given of the configuration of a latch circuit of a third embodiment. In this regard, in the latch circuit of the third embodiment, parts common to the latch circuits of the first or second embodiment are designated the same reference numerals. In addition, the same descriptions are omitted.

FIGS. 10A, B illustrate circuit diagrams of the latch circuit of the third embodiment. As illustrated in FIG. 10A, latch circuit 2 comprises a level shift circuit in place of the voltage control circuit in the latch circuit described in the first or second embodiment. As compared with the latch circuit in the first or second embodiment, part of the circuit connections is different. In latch circuit 2 illustrated in FIG. 10A, current switching transistor Q5 has the base connected to clock input terminal 13a and to level shift circuit 24. Thus, a clock signal applied from clock input terminal 13a is branched into two lines which are fed to the base of current switching transistor Q5 and to level shift circuit 24. Then, level shift circuit 24 is connected to the base of current source transistor Q8.

On the other hand, current switching transistor Q6 has the base connected to clock input terminal 13b and to level shift circuit 25. Thus, a complementary clock signal applied from clock input terminal 13b is branched into two lines which are fed to the base of current switching transistor Q6 and to level shift circuit 25. Then, level shift circuit 25 is connected to the base of current source transistor Q7.

In this way, similar to the first and second embodiments, the amount of current supplied by current source transistor Q7 (or Q8) can be controlled in synchronization with opening/closing of bypass path 20 (or 21), thus restraining unwanted leak current from flowing into differential pair 16 (or 17).

For reference purposes, current source transistor Q7 and level shift circuit 25 function as first control means in the present invention, and current source transistor Q8 and level shift circuit 24 function as second control means in the present invention.

Figure 10B:
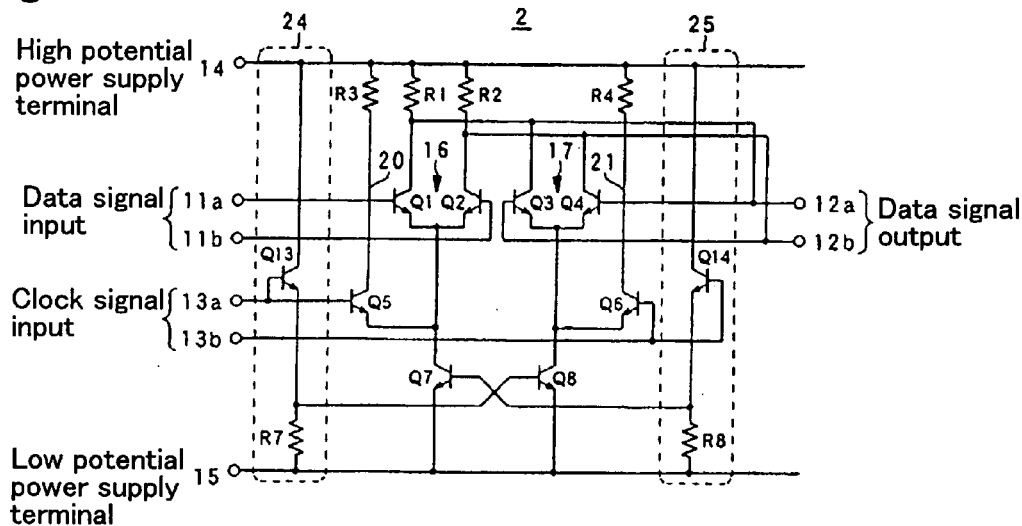
[FIG. 10B]
A circuit diagram illustrating details of level shift circuits 24, 25 in the latch circuit of FIG. 10A.

FIG. 10B illustrates a specific example of level shifts 24 and 25. Level shift circuit 24 (or 25) comprises transistor Q13 (or Q14) and the like. Transistor Q13 (or Q14) has a collector connected to high potential power supply terminal 14; a base connected to the base of current switching transistor Q5 (or Q6); and an emitter connected to low potential power supply terminal 15 through resistor R7 (or R8), and also connected to the base of transistor Q8 (or Q7).

Referring next to FIG. 10B, a description will be given of the operation of the latch circuit of the third embodiment.

When a clock signal applied from clock signal input terminal 13a is at a low level, current switching transistor Q5 does not operate (off operation), causing first bypass path 20 to open (non-conducting state). In this event, since a complementary clock signal applied from clock signal input terminal 13b is at a high level, an increased amount of current flows through transistor Q14 and resistor R8 in level shift circuit 25. Thus, voltage at a high potential level is applied to the base point of current source transistor Q7, resulting in an increase in the amount of collector current of current source transistor Q7. In other words, level shift circuit 25 applies voltage at the high potential level to the base point of current source transistor Q7 in synchronization with the opened state of first bypass path 20. As a result, current source transistor Q7 supplies a sufficient amount of current to data reading differential pair 16. For reference purposes, in this event, a reduced amount of current flows through transistor Q13 and resistor R7 in level shift circuit 24, with the result that voltage at a low potential level is applied to the base point of current source transistor Q8.

On the other hand, when the clock signal applied from clock signal input terminal 13a is at a high level, current switching transistor Q5 operates (on operation), causing first bypass path 20 to close (conducting state). In this event, since the complementary clock signal applied from clock signal input terminal 13b is at a low level, a reduced amount of current flows through transistor Q14 and resistor R8 in level shift circuit 25. Thus, voltage at a low potential level is applied to the base point of current source transistor Q7, causing a reduction in the amount of collector current of current source transistor Q7. In other words, level shift circuit 25 applies voltage at the low potential level to the base point of current source transistor Q7 in synchronization with the closed state of first bypass path 20. As a result, the amount of unwanted leak current is also restrained from flowing into data reading differential pair 16. For reference purposes, in this event, an increasing amount of current flows through transistor Q13 and resistor R7 in level shift circuit 24, with the result that voltage at a high potential level is applied to the base point of current source transistor Q8.

As described above, according to the third embodiment, even when a level shift circuit is used to build a circuit, unwanted leak current can be automatically restrained from flowing into differential pairs 16 and 17 in a manner similar to the first and second embodiments.

(Fourth Embodiment)

Referring to FIGS. 11A, B, a description will be given of the configuration of a latch circuit of a fourth embodiment. In this regard, in the latch circuit of the fourth embodiment, parts common to the latch circuit in the first or second embodiment are designated the same reference numerals. In addition, the same descriptions are omitted.

FIGS. 11A, B illustrate circuit diagrams of the latch circuit of the fourth embodiment. As illustrated in FIG. 11A, in latch circuit 3, a circuit element having inductance component L and a circuit element having capacitance component C are connected in parallel to the collectors of current switching transistors Q5 and Q6.

Here, the circuit element having inductance component L is implemented by extending a wire between the collector point of current switching transistor Q5 (or Q6) and high potential power supply terminal 14, or by inserting herein a spiral inductor. On the other hand, circuit element 26 (or 27) having capacitance component C is implemented, for example, by the voltage control circuit described in the second embodiment.

FIG. 11B illustrates an example which employs the voltage control circuit for the circuit element having capacitance component C. In the latch circuit of the fourth embodiment, inductors L1, L2 are interposed between the collector points of current switching transistors Q5, Q6 and high potential power supply terminal 14, through resistors R3, R4, respectively, and inductors are interposed between the collector of transistor Q1 and resistor R1 and between the collector of transistor Q2 and resistor R2, respectively. The rest of circuit configuration in latch circuit 3 is similar to latch circuit 1b (FIG. 7B) in the second embodiment, and the operation of latch circuit 3 is also similar to the operation of latch circuit 1b of the second embodiment.

Consequently, according to latch circuit 3 of the fourth embodiment, effects similar to those of latch circuit 1b can be provided. Specifically, unwanted leak current can be automatically restrained from flowing into differential pairs 16 and 17.

Further, according to latch circuit 3 of the fourth embodiment, an effect that improves high-speed performance is realized. Specifically, by inserting inductors L1, L2 between the collector points of current switching transistors Q5, Q6 and high potential power supply terminal 14, as described above, parallel resonance arises between inductance component L added thereto and base-emitter capacitance Cbe possessed by transistor Q9 (or Q10) in voltage control circuit 26 (or 27). When a value is selected for component L that should be added with respect to the value of Cbe such that a resonance frequency appears in a desired high-frequency region, the gain can be increased in the desired high-frequency region. As a result, it is possible to improve the high-speed performance of the switching means (circuit unit) made up of transistors Q5, Q6, which receives a complementary clock signal to perform a current switching operation.

Figure 4:
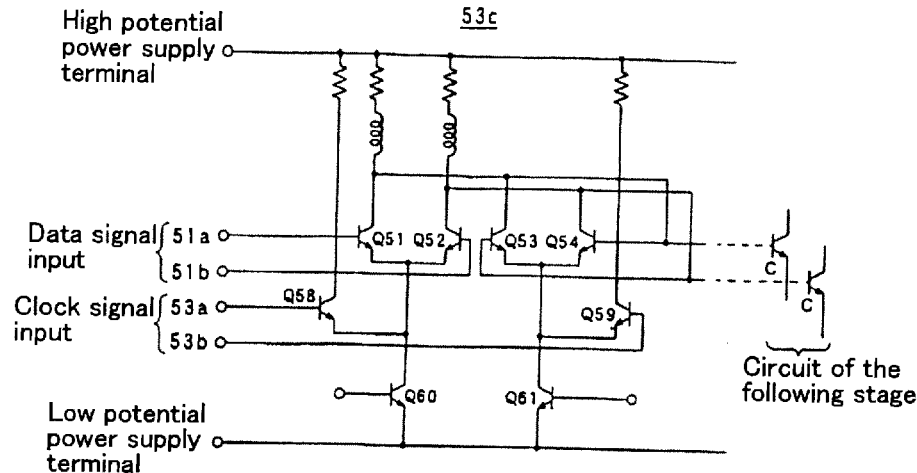
[FIG. 4]
A circuit diagram of a parallelly arranged latch circuit in the prior art which has improved high-speed performance.

For reference purposes, the method of increasing the speed through the insertion of inductors has been conventionally and widely used in differential pairs 16 and 17. However, such a method has conventionally experienced difficulties in producing the foregoing effect when it is used in the switching circuit unit made up of transistors Q5, Q6 for performing the current switching operation. Specifically, since the output of the differential pair side is always applied to a transistor in a circuit at the next stage, as illustrated in FIG. 4, parallel resonance can be produced between capacitance Cbe possessed by the transistor and inserted inductor L, whereas there are no circuit elements, such as transistor having large capacitance component, that have not been conventionally connected to the output side of a switching circuit unit so that simple insertion of inductors does not lead to the resonance. In latch circuit 3 of this embodiment, since the voltage control circuit is connected to the output side (collector side of current switching transistor Q5, Q6) of the switching circuit unit, inserting inductor L can have the effect of improving high-speed performance.

(Fifth Embodiment)

Figure 12A:
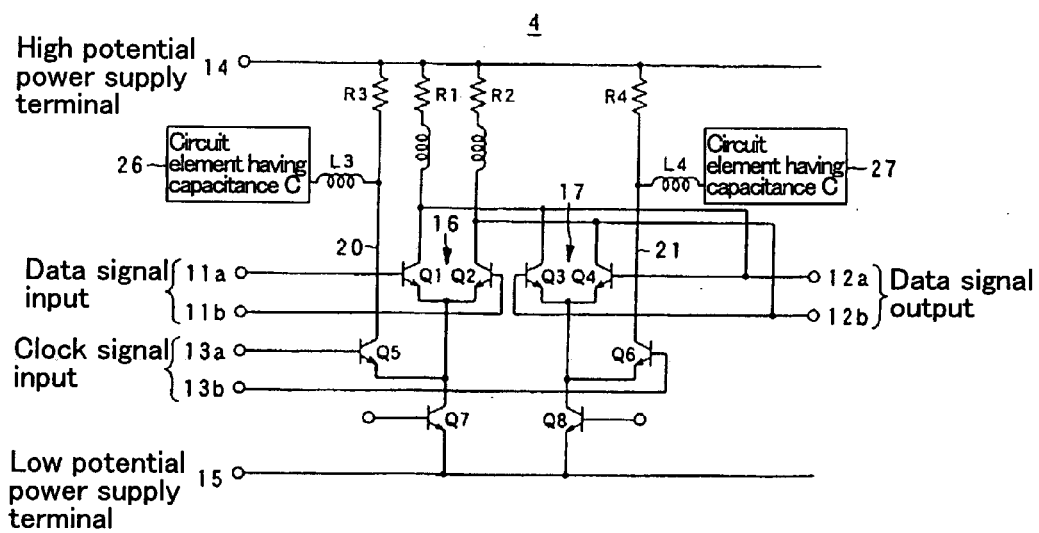
[FIG. 12A]
A circuit diagram of a latch circuit according to a fifth embodiment of the present invention.

Referring to FIGS. 12A, B, a description will be given of the configuration of a latch circuit of a fifth embodiment. In this regard, in the latch circuit of the fifth embodiment, parts common to the latch circuit in the first or second embodiment are designated the same reference numerals. In addition, the same descriptions are omitted.

FIGS. 12A, B illustrate circuit diagrams of the latch circuit of the fifth embodiment. As illustrated in FIG. 12A, in latch circuit 4, a circuit element having inductance component L and a circuit element having capacitance component C are connected in series to the collectors of current switching transistors Q5 and Q6.

Here, the circuit element having inductance component L is implemented by extending a wire between the collector point of current switching transistor Q5 (or Q6) and high potential power supply terminal 14, or by inserting herein a spiral inductor. On the other hand, the circuit element having capacitance component C is implemented, for example, by the voltage control circuit described in the second embodiment.

Figure 12B:
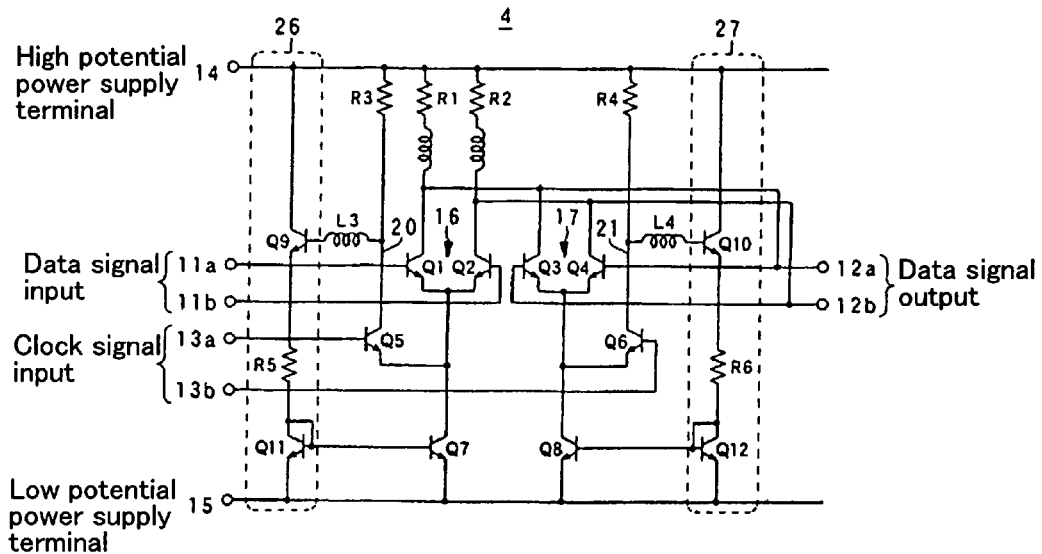
[FIG. 12B]
A circuit diagram illustrating details of circuits 26, 27 including capacitance C in the latch circuit of FIG. 12A.

FIG. 12B illustrates an example which employs the voltage control circuit for the circuit element having capacitance component C. In latch circuit 4 of the fifth embodiment, inductors L3, L4 are interposed between the collector points of current switching transistors Q5, Q6 and the base points of transistors Q9, Q10 in voltage control circuits 26, 27, respectively, and inductors are interposed between the collector of transistor Q1 and resistor R1 and between the collector of transistor Q2 and resistor R2, respectively. The rest of the circuit configuration in latch circuit 4 is similar to latch circuit 1b (FIG. 7B) in the second embodiment. The operation of latch circuit 4 is also similar to the operation of latch circuit 1b of the second embodiment.

Consequently, according to latch circuit 3 of the fourth embodiment, effects similar to those of latch circuit 1b can be provided. Specifically, unwanted leak current can be automatically restrained from flowing into differential pairs 16 and 17.

Further, according to latch circuit 4 of the fifth embodiment, has the effect of improving high-speed performance. Specifically, by inserting inductors L3, L4 between the collector points of current switching transistors Q5, Q6 and the base points of transistors Q9, Q10, respectively, as described above, serial resonance arises between inductance component L added thereto and base-emitter capacitance Cbe possessed by transistor Q9 (or Q10) in voltage control circuit 26 (or 27). When a value is selected for component L that should be added respect to the value of Cbe such that a resonance frequency appears in a desired high-frequency region, the gain can be increased in the desired high-frequency region. As a result, it is possible to improve the high-speed performance of the switching means (circuit unit) made up of transistors Q5, Q6, which receives a complementary clock signal to perform a current switching operation.

(Sixth Embodiment)

Figure 13:
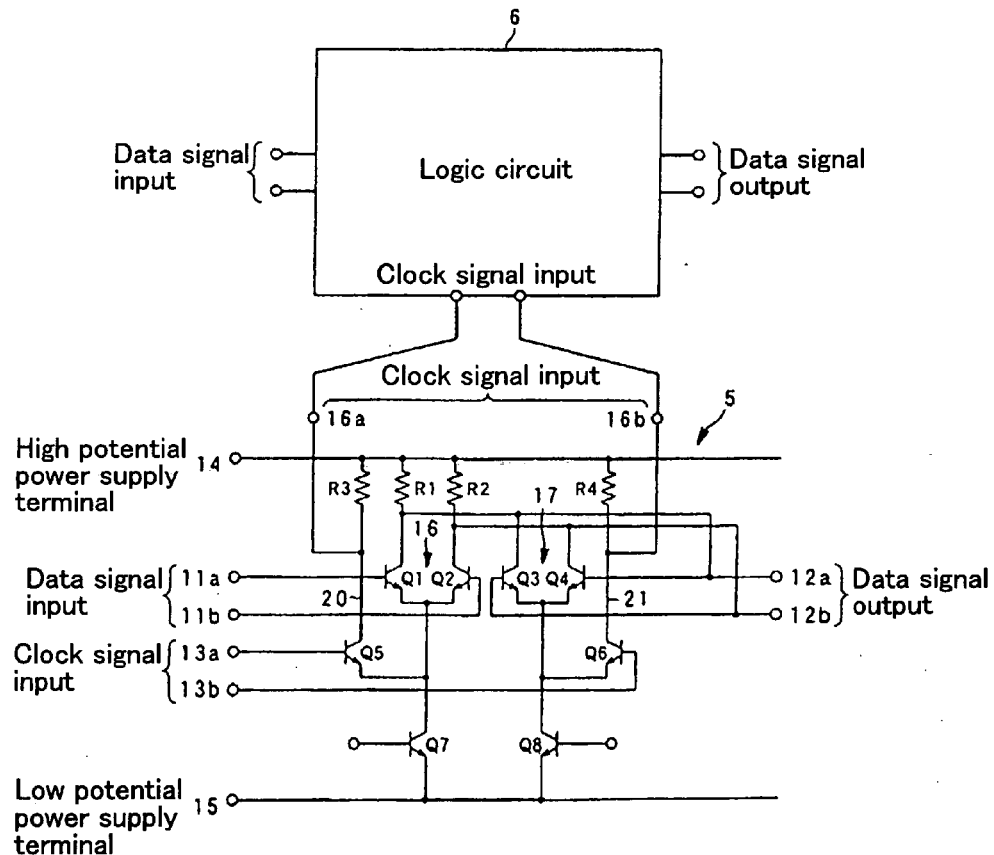
[FIG. 13]
A circuit diagram of a latch circuit according to a sixth embodiment of the present invention.

Referring to FIG. 13, a description will be given of the configuration of a latch circuit of a sixth embodiment. In this regard, in the latch circuit of the sixth embodiment, parts common to the latch circuit in the first or second embodiment are designated the same reference numerals. In addition, the same descriptions are omitted.

FIG. 13 illustrates a circuit diagram of the latch circuit of the sixth embodiment. Latch circuit 5 comprises output terminals 16a, 16b for sending a clock signal to the other logic circuit (for example, a functional circuit such as a flip-flop circuit) 6, and current switching transistors Q5, Q6 have their collectors connected to output terminals 16a, 16b, respectively. Then, output terminals 16a, 16b are connected to clock input terminals of the other logic circuit 6. In this way, latch circuit 5 can send a complementary clock signal (information on the signal level at the collectors of current switching transistors Q5, Q6) to the other logic circuit 6 through output terminals 16a, 16b, while simultaneously functioning essentially as a latch circuit. For reference purposes, voltage control circuits 18, 19, described in the first embodiment, are connected to the bases of current source transistors Q7, Q8, respectively.

Figure 14A:
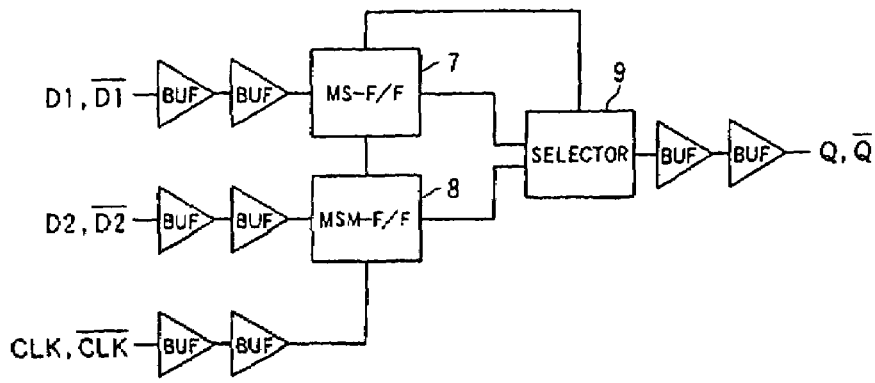
[FIG. 14A]
A circuit block diagram of 2:1 MUX which is built using latch circuit 5 of FIG. 13.

FIG. 14A is a circuit block diagram of 2:1 MUX which is built using latch circuits 5 illustrated in FIG. 13. In FIG. 14A, all or part of master/slave type flip-flop circuit (MS-F/F) 7, master/slave/master type flip-flop circuit (MSM-F/F) 8, and selector circuit (SELECTOR) 9 are built using latch circuit 5 illustrated in FIG. 13.

Figure 5:
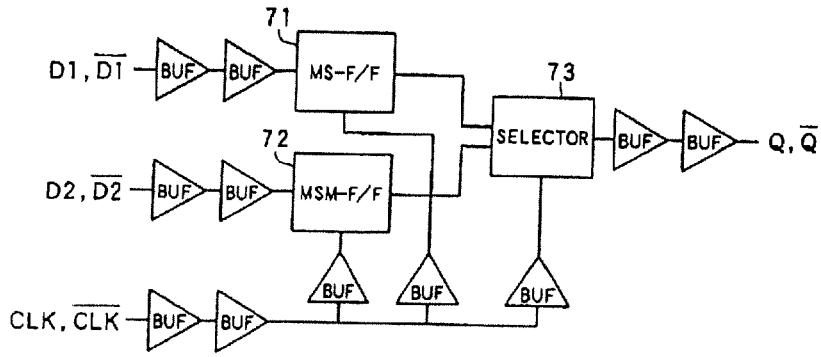
[FIG. 5]
A circuit block diagram of prior art 2:1 MUX.

Therefore, according to the circuit blocks illustrated in FIG. 14A, a complementary clock signal need not be supplied to respective circuit elements through independent paths, as the circuit blocks of conventional 2:1 MUX illustrated in FIG. 5, but the respective circuit elements can be connected in series without branching a clock signal path into a large number of paths. Accordingly, since no buffer circuit (BUF) is required on each branch for signal amplification, the number of buffer circuits can be largely reduced which consequently provides a large reduction in power consumption.

Figure 14B:
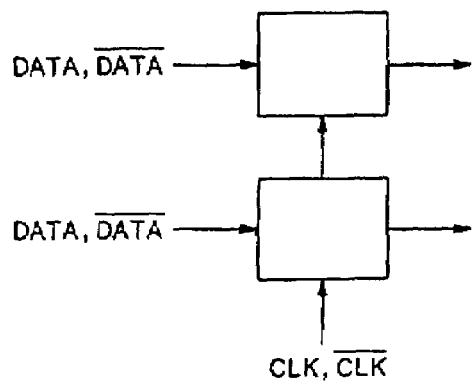
[FIG. 14B]
A circuit block diagram of a circuit which is built using latch circuit 5 of FIG. 13.

While the foregoing has shown an example in which latch circuit 5 illustrated in FIG. 14A is applied to 2:1 MUX, the present invention is not only limited to this configuration, but can also be applied, for example, to overall circuit blocks illustrated in FIG. 14B.

While the first to sixth embodiments described above have shown examples in which the current supply control circuit of the present invention is mainly applied to a latch circuit, the present invention is not only limited to this configuration, but can be applied to any semiconductor integrated circuit as a basic element circuit for a variety of logic circuits, for example, a data read circuit having a differential circuit, a selector circuit, and the like. In the following, referring to FIG. 15, a description will be given of an example in which the current supply control circuit of the present invention is applied to a selector circuit.

Figure 15:
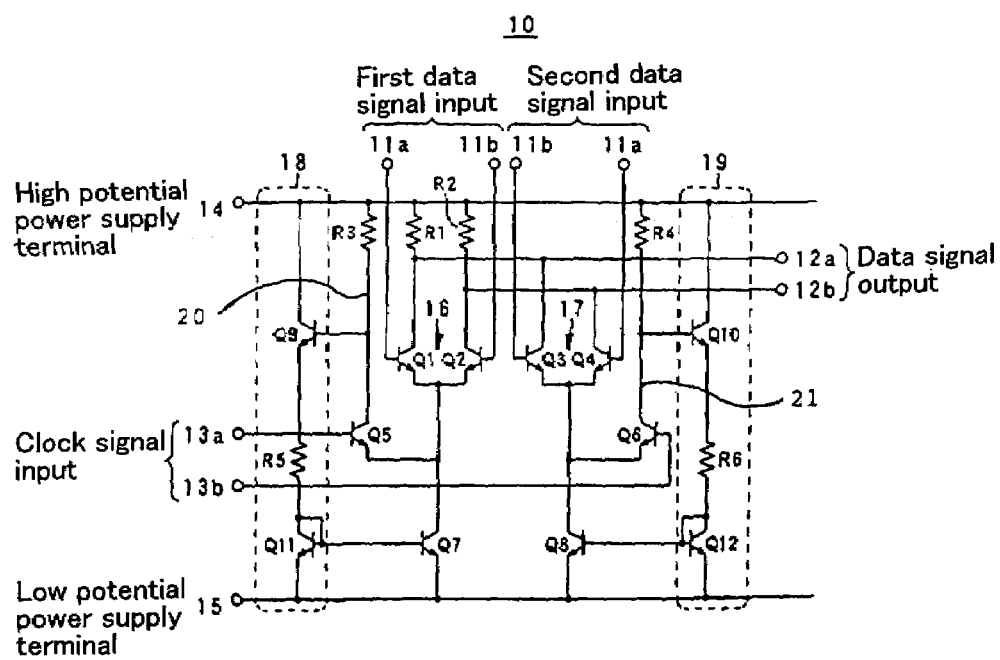
[FIG. 15]
A circuit diagram of a selector circuit according to the present invention.

FIG. 15 illustrates a circuit diagram of a selector circuit to which the current supply control circuit of the present invention is applied. In this regard, while selector circuit 10 illustrated in FIG. 15 is slightly different from connections in latch circuit 1b illustrated in FIG. 7B, circuit components such as transistors, resistors and the like are the same, so that they are designated the same reference numerals. In addition, the same descriptions are omitted.

As illustrated in FIG. 15, selector circuit 10 includes first data reading differential pair 16 as a first differential circuit for reading first data signals applied from first data signal input terminals 11a and 11b; second data reading differential pair 17 as a second differential circuit for reading second data signals applied from second data signal input terminals 11c and 11d; voltage control circuit 18 and current source transistor Q7 as first control means for controlling the amount of current supplied to first data reading differential pair 16; voltage control circuit 19 and current source transistor Q8 as second control means for controlling the amount of current supplied to second data reading differential pair 17; first bypass path for bypassing current around first data read differential pair 16; second bypass path 21 for bypassing current around second data reading differential pair 17; current switching transistor Q5 as first switching means for opening/closing first bypass path 20 in accordance with the signal level of a clock signal applied from clock signal input terminal 13a; and current switching transistor Q6 as second switching means for opening/closing second bypass path 21 in accordance with the signal level of a complementary clock signal applied from clock signal input terminal 13b.

For reference purposes, bypass path 20, current switching transistor Q5, voltage control circuit 18, and current source transistor Q7 (or bypass path 21, current switching transistor Q6, voltage control circuit 19, and current source transistor Q8) function as the current supply control circuit of the present invention.

In selector circuit 10, first data reading differential pair 16 fetches a first data complementary signal in synchronization with the clock signal, second data reading differential pair 17 fetches a second data complementary signal in synchronization with the complementary clock signal, and the first and second data complementary signals are alternately delivered from data signal output terminals 12a, 12b, wherein the current supply control circuit of the present invention is applied, thereby producing effects similar to the first and second embodiments.

Alternatively, the foregoing selector circuit 10 may be built in a circuit configuration as illustrated in the aforementioned third to sixth embodiments, in which case effects similar to those in the third to sixth embodiments can be produced.

Also, while the foregoing embodiments have been described on the assumption that bipolar transistors are representative of active elements, the present invention is not limited to any type of active elements, but can be applied similarly, for example, to such elements as FETs. Also, while the transistors shown in FIG. 6 and the like apply npn-type transistors, pnp-type transistors may be employed instead.

The invention claimed is:

1. A current supply control circuit for controlling an amount of current supplied to a differential circuit, comprising:

a bypass path for bypassing current around said differential circuit;

switching means, interposed in said bypass path, for opening/closing said bypass path in accordance with a signal level of a clock signal; and control means for controlling the amount of current supplied to said differential circuit in accordance with the signal level of the clock signal;

said bypass path and said control means configured such that the amount of current supplied to said differential circuit is reduced in a case where said switching means closes said bypass path to cause current to flow through said bypass path.

2. The current supply control circuit according to claim 1, wherein said control means adjusts the amount of current in synchronization with opening/closing of said bypass path.

3. The current supply control circuit according to claim 2, wherein:
said switching means has a current switching transistor, said currents switching transistor having an emitter connected to a common emitter of said differential circuit, and
said control means is connected to a connection point between the emitter of said current switching transistor and the common emitter of said differential circuit.

4. The current supply control circuit according to claim 3, wherein a parallel circuit comprising a circuit element having an inductance component and a circuit element having a capacitance element is connected to a collector of said current switching transistor.

5. The current supply control circuit according to claim 3, wherein a series circuit comprising a circuit element having an inductance component with a circuit element having a capacitance component is connected to a collector of said current switching transistor.

6. The current supply control circuit according to claim 1, wherein said bypass path is directly connected to a common emitter of said differential circuit.

7. A current supply control circuit for controlling an amount of current supplied to a differential circuit, comprising:
a bypass path for bypassing current around said differential circuit;
switching means, interposed in said bypath pass, for opening/closing said bypass path in accordance with a signal level of a clock signal applied from the outside; and
control means for controlling the amount of current supplied to said differential circuit in accordance with the signal level of the clock signal;
wherein said switching means has a current switching transistor, said current switching transistor having an emitter connected to a common emitter of said differential circuit, and
wherein said control means is connected to a connection point between the emitter of said current switching transistor and the common emitter of said differential circuit.

8. The current supply control circuit according to claim 7, wherein:
said control means has a current source transistor, said current source transistor having a collector connected to the connection point, and
said control means further comprises a feedback path for applying information about a signal level at a collector of said current switching transistor to a base of said current source transistor.

9. The current supply control circuit according to claim 8, wherein a parallel circuit comprising a circuit element having an inductance component and a circuit element having a capacitance element is connected to a collector of said current switching transistor.

10. The current supply control circuit according to claim 8, wherein a series circuit comprising a circuit element having an inductance component with a circuit element having a capacitance component is connected to a collector of said current switching transistor.

11. The current supply control circuit according to claim 7, wherein said control means comprises an output terminal for sending information on a signal level at a collector of said current switching transistor to another logic circuit.

12. The current supply control circuit according to claim 11, wherein a parallel circuit comprising a circuit element having an inductance component and a circuit element having a capacitance element is connected to a collector of said current switching transistor.

13. The current supply control circuit according to claim 11, wherein a series circuit comprising a circuit element having an inductance component with a circuit element having a capacitance component is connected to a collector of said current switching transistor.

14. The current supply control circuit according to claim 7, wherein a parallel circuit comprising a circuit element having an inductance component and a circuit element having a capacitance element is connected to a collector of said current switching transistor.

15. The current supply control circuit according to claim 7, wherein a series circuit comprising a circuit element having an inductance component with a circuit element having a capacitance component is connected to a collector of said current switching transistor.

16. A current supply control circuit for controlling an amount of current supplied to a differential circuit, comprising:
a bypass path for bypassing current around said differential circuit;
switching means, interposed in said bypath pass, for opening/closing said bypass path in accordance with signal level of a clock signal applied from the outside; and
control means for controlling the amount of current supplied to said differential circuit in accordance with the signal level of the clock signal;
wherein said control means adjusts the current so that the amount of current supplied to said differential circuit when the signal level of the clock signal is at a low level is larger than the amount of current supplied to said differential circuit when the signal level of the clock signal is at a high level.

17. The current supply control circuit according to claim 16, wherein a parallel circuit comprising a circuit element having an inductance component and a circuit element having a capacitance element is connected to said switching means.

18. The current supply control circuit according to claim 16, wherein a series circuit comprising a circuit element having an inductance component with a circuit element having a capacitance component is connected to said switching means.

19. A latch circuit comprising:
a first differential circuit for reading a data signal,
a second differential circuit for holding the data signal,
a first current supply control circuit for controlling an amount of current supplied to said first differential circuit, and
a second current supply control circuit for controlling an amount of current supplied to said second differential circuit,
wherein said first current supply control circuit comprises:
a first bypass path for bypassing current around said first differential circuit;
first switching means, interposed in said first bypass path, for opening/closing said first bypass path in accordance with a signal level of a clock signal; and first control means for controlling the amount of current supplied to said first differential circuit, wherein said second current supply control circuit comprises:
a second bypass path for bypassing current around said second differential circuit;
second switching means, interposed in said second bypass path, for opening/closing said second bypass path in accordance with a signal level of a clock complementary signal, said clock complementary signal having a signal level that is an inverse of that of the clock signal; and
second control means for controlling the amount of current supplied to said second differential circuit, and wherein said first bypass path and said first control means are configured such that the amount of current supplied to said first differential circuit is reduced in a case where said first switching means closes said first bypass path to cause current to flow through said first bypass path.

20. The latch circuit according to claim 19, wherein:
said first switching means has a first current switching transistor, said first current switching transistor having an emitter connected to a common emitter of said first differential circuit,
said first control means has a first current source transistor, said first current source transistor having a collector connected to the common emitter of said first differential circuit,
said second switching means has a second current switching transistor, said second current switching transistor having an emitter connected to a common emitter of said second differential circuit,
said second control means has a second current source transistor, said second current source transistor having a collector connected to the common emitter of said second differential circuit,
said first current switching transistor has a base connected to a base of said second current source transistor through a first level shift circuit, and
said second current switching transistor has a base connected to the base of said first current source transistor through a second level shift circuit.

21. The latch circuit according to claim 19, wherein said first control means adjusts the amount of current supplied to said first differential circuit in accordance with the signal level of the clock signal, and said second control means adjusts the amount of current supplied to said second differential circuit in accordance with the signal level of the clock complementary signal.

22. A selector circuit comprising:
a first differential circuit for reading a first data signal,
a second differential circuit for reading a second data signal,
a first current supply control circuit for controlling an amount of current supplied to said first differential circuit, and
a second current supply control circuit for controlling an amount of current supplied to said second differential circuit,
wherein said first current supply control circuit comprises:
a first bypass path for bypassing current around said first differential circuit;
first switching means, interposed in said first bypass path, for opening/closing said first bypass path in accordance with a signal level of a clock signal; and first control means for controlling the amount of current supplied to said first differential circuit, wherein said second current supply control circuit comprises:
a second bypass path for bypassing current around said second differential circuit;
second switching means, interposed in said second bypass path, for opening/closing said second bypass path in accordance with a signal level of a clock complementary signal, said clock complementary signal having a signal level that is an inverse of that of the clock signal; and
second control means for controlling the amount of current supplied to said second differential circuit, wherein said first bypass path and said first control means are configured such that the amount current supplied to said first differential circuit is reduced in a case where said first switching means closes said first bypass path to cause current to flow through said first bypass path.

23. The selector circuit according to claim 22, wherein:
said first switching means has s first current switching transistor, said first current switching transistor having an emitter connected to a common emitter of said first differential circuit,
said first control means has a first current source transistor, said first current source transistor having a collector connected to the common emitter of said first differential circuit,
said second switching means has a second current switching transistor, said second current switching transistor having an emitter connected to a common emitter of said second differential circuit,
said second control means has a second current source transistor, said second current source transistor having a collector connected to the common emitter of said second differential circuit,
said first current switching transistor has a base connected to a base of said second current source transistor through a first level shift circuit, and
said second current switching transistor has a base connected to a base of said first current source transistor through a second level shift circuit.

24. The selector circuit according to claim 22, wherein said first control means adjusts the amount of current supplied to said first differential circuit in accordance with the signal level of the clock signal, said second control means adjusts the amount of current supplied to said second differential circuit in accordance with the signal level of the clock complementary signal.

25. A circuit block comprising:
a current supply control circuit comprising:
a bypass path for bypassing current around a differential circuit;
switching means, interposed in said bypath pass, for opening/closing said bypass path in accordance with a signal level of a clock signal applied from the outside; and
control means for controlling an amount of current supplied to said differential circuit in accordance with the signal level of the clock signal; and
a first and a second logic circuit for processing a data signal applied from the outside in synchronization with a change in signal level of a corresponding clock signal, wherein:
said switching means has a current switching transistor, said current switching transistor having an emitter connected to a common emitter of said differential circuit, and
said control means is connected to a connection point between the emitter of said current switching transistor and the common emitter of said differential circuit,
wherein said control means comprises an output terminal for sending information on a signal level at a collector of said current switching transistor to another logic circuit, and
wherein said first logic circuit delivers the information about the signal level at the collector of the current switching transistor included in said current supply control circuit to said second logic circuit as the clock signal corresponding to the second logic circuit.

* * * * *